United States Patent
Okada et al.

(10) Patent No.: US 7,691,662 B2
(45) Date of Patent: Apr. 6, 2010

(54) OPTICAL MODULE PRODUCING METHOD AND APPARATUS

(75) Inventors: Toru Okada, Kawasaki (JP); Masanao Fujii, Kawasaki (JP); Yutaka Noda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 512 days.

(21) Appl. No.: 11/703,699

(22) Filed: Feb. 8, 2007

(65) Prior Publication Data
US 2008/0102544 A1  May 1, 2008

(30) Foreign Application Priority Data
Oct. 27, 2006  (JP)  .............. 2006-291992

(51) Int. Cl.
*H01L 21/00*  (2006.01)
(52) U.S. Cl. ............ 438/64; 228/180.22; 257/E21.509
(58) Field of Classification Search .................. 438/61, 438/64, 612, 613
See application file for complete search history.

(56) References Cited

U.S. PATENT DOCUMENTS

| | | | | |
|---|---|---|---|---|
| 3,871,015 A | * | 3/1975 | Lin et al. .................... | 257/779 |
| 5,973,406 A | * | 10/1999 | Harada et al. ................ | 257/780 |
| 6,333,483 B1 | | 12/2001 | Ueno | |
| 6,441,339 B1 | | 8/2002 | Ueno | |
| 6,642,626 B2 | * | 11/2003 | Park ........................... | 257/778 |
| 6,757,966 B2 | | 7/2004 | Inoue et al. | |

FOREIGN PATENT DOCUMENTS

| | | |
|---|---|---|
| CN | 1201364 A | 12/1998 |
| CN | 1350421 A | 5/2002 |
| JP | 64-4095 A | 1/1989 |
| JP | 9-55565 A | 2/1997 |
| JP | 2006-66418 A | 3/2006 |

OTHER PUBLICATIONS

Chinese Office Action issued Apr. 17, 2009 in Corresponding Chinese Patent Application No. 200710078760.4.

* cited by examiner

*Primary Examiner*—David A Zarneke
(74) *Attorney, Agent, or Firm*—Westerman, Hattori, Daniels & Adrian, LLP

(57) ABSTRACT

An optical module is produced by coating, with respect to a substrate having a substrate surface provided with terminal pads and landing pads a solder material on the terminal pads, mounting an optical element package having terminals and a flat top surface on the substrate using the landing pads so that the top surface becomes approximately parallel to the substrate surface and a gap is formed between a bottom surface of the optical element package and the substrate surface, preheating the terminal pads simultaneously as the mounting, and electrically connecting the terminal pads to corresponding terminals of the optical element package by melting the solder material and thereafter hardening the solder material.

9 Claims, 14 Drawing Sheets

| | MELTING START TIME | DURABILITY | HEAT CONDUCTIVITY $[W \cdot m^{-1} \cdot K^{-1}]$ |
|---|---|---|---|
| Cu+Cr | ○ : 1~3 SECONDS | × : 1,500 TIMES | 381.0 |
| SUS | × : 7~10 SECONDS | ○ : 20,000 TIMES | 19.0 |
| G04+Cr | ○ : 3~5 SECONDS | ○ : 20,000 TIMES | 37.5 |

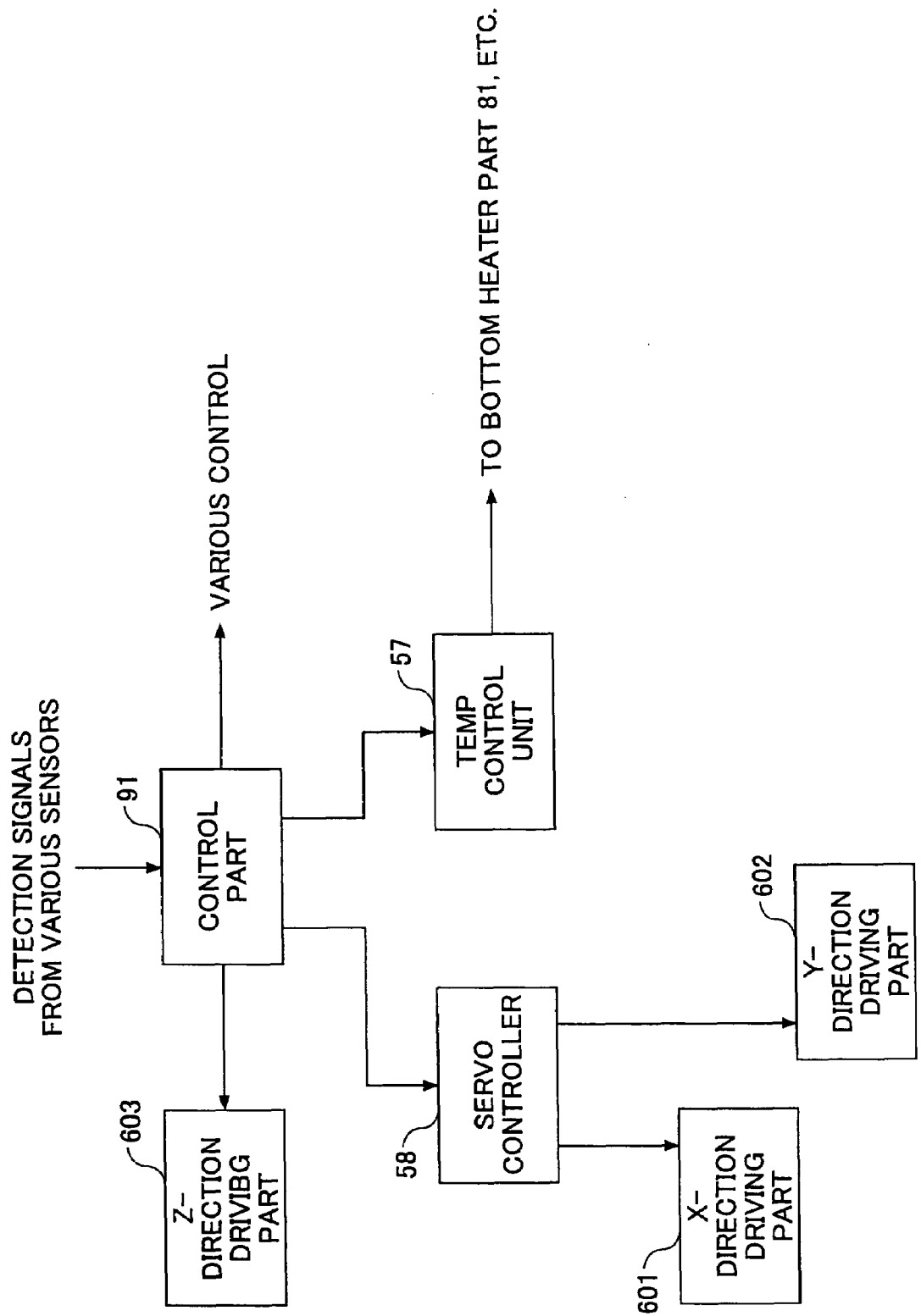

OPTICAL MODULE PRODUCING METHOD AND APPARATUS

BACKGROUND OF THE INVENTION

1. Field of the Invention

The present invention generally relates to optical module producing methods and apparatuses, and more particularly to an optical module producing method and an optical module producing apparatus for producing an optical module that mounted with an optical element such as a light receiving element.

2. Description of the Related Art

Optical modules are used in various applications, including cameras for vehicles, security systems and the like. The optical module is made up of a substrate, an optical element that is mounted on the substrate. For example, the optical element is a CCD or a CMOS device.

There are demands to decrease the size of the optical module without deteriorating the reliability of the optical module. For this reason, the optical element must be accurately positioned relative to the substrate, and electrical connections between the optical element and other parts on the substrate must not easily deteriorate with time or in response to externally applied shock.

Conventionally, the optical element is mounted on the substrate manually, by manually soldering terminals of the optical element to corresponding terminals on the substrate.

But when the optical element is mounted on the substrate manually, it is difficult to accurately position the optical element three-dimensionally relative to the substrate surface. If the optical element is not mounted in a parallel state relative to the substrate surface, an optical axis of the optical element will become inclined from a normal to the substrate surface, to thereby deteriorate the performance of the optical module.

The optical element may be mounted on the substrate so that the bottom surface of the optical element makes contiguous contact with the substrate surface, to ensure the optical element in a parallel state relative to the substrate surface. But when the terminals of the optical element are soldered to the corresponding terminals on the substrate, the solder easily cracks to deteriorate the reliability of the optical module. The crack in the solder is generated with time when temperature changes occur, because the coefficients of thermal expansion are usually different between the materials used for the substrate and the optical element, and the contiguous contact between the optical element and the substrate will not allow the stress caused by the difference between the coefficients of thermal expansion to be absorbed. Moreover, the crack in the solder is generated in response to an externally applied shock, because the contiguous contact between the optical element and the substrate will not allow the shock to be absorbed.

Furthermore, when the terminals of the optical element are manually soldered to the corresponding terminals on the substrate, it is difficult to uniformly control the amount of solder applied to each terminal, particularly since the intervals of the terminals become extremely short as the size of the optical module is reduced. Consequently, it is difficult to uniformly control the reliability of the optical modules. In addition, the manual soldering makes it difficult to manufacture the optical modules with a high efficiency and at a low cost.

For example, a Japanese Laid-Open Patent Application No. 1-4095 proposes a solder supply apparatus that supplies solder paste onto a surface mount type substrate. A Japanese Laid-Open Patent Application No. 9-55565 proposes a printed wiring board that improves the removability of the surface mount type parts. A Japanese Laid-Open Patent Application No. 2006-66418 proposes a mounting apparatus for mounting electronic parts in parallel to a substrate.

Conventionally, there was a problem in that it is difficult to produce an optical module having a desired performance and a high reliability, even when the size of the optical module is reduced.

SUMMARY OF THE INVENTION

Accordingly, it is a general object of the present invention to provide a novel and useful optical module producing method and apparatus, in which the problem described above are suppressed.

Another and more specific object of the present invention is to provide an optical module producing method and an optical module producing apparatus, which can produce an optical module having a desired performance and a high reliability even when the size of the optical module is reduced.

Still another object of the present invention is to provide an optical module producing method comprising the steps of (a) with respect to a substrate having a substrate surface provided with terminal pads and landing pads, coating a solder material on the terminal pads; (b) mounting an optical element package having terminals and a flat top surface on the substrate using the landing pads so that the top surface becomes approximately parallel to the substrate surface and a gap is formed between a bottom surface of the optical element package and the substrate surface; (c) preheating the terminal pads simultaneously as carrying out the step (b); and (d) electrically connecting the terminal pads to corresponding terminals of the optical element package by melting the solder material and thereafter hardening the solder material. According to the optical module producing method of the present invention, it is possible to produce an optical module having a desired performance and a high reliability, even when the size of the optical module is reduced.

A further object of the present invention is to provide an optical module producing apparatus comprising a movable stage unit on which a substrate having a substrate surface mounted with terminal pads and landing pads is set; a coating unit configured to coat a solder material on the terminal pads when the stage unit moves to a coating position; a mounting unit configured to mount an optical element package having terminals and a flat top surface on the substrate using the landing pads when the stage unit moves to a mounting position, so that the top surface becomes approximately parallel to the substrate surface and a gap is formed between a bottom surface of the optical element package and the substrate surface; a preheating part configured to preheat the terminal pads simultaneously as the mounting of the optical element package on the substrate; and a soldering part configured to electrically connect the terminal pads to corresponding terminals of the optical element package by melting the solder material and thereafter hardening the solder material. According to the optical module producing apparatus of the present invention, it is possible to produce an optical module having a desired performance and a high reliability, even when the size of the optical module is reduced.

Other objects and further features of the present invention will be apparent from the following detailed description when read in conjunction with the accompanying drawings.

BRIEF DESCRIPTION OF THE DRAWINGS

FIG. 17 is a system block diagram showing a control system of the optical module producing apparatus.

DESCRIPTION OF THE PREFERRED EMBODIMENTS

Figure 1:
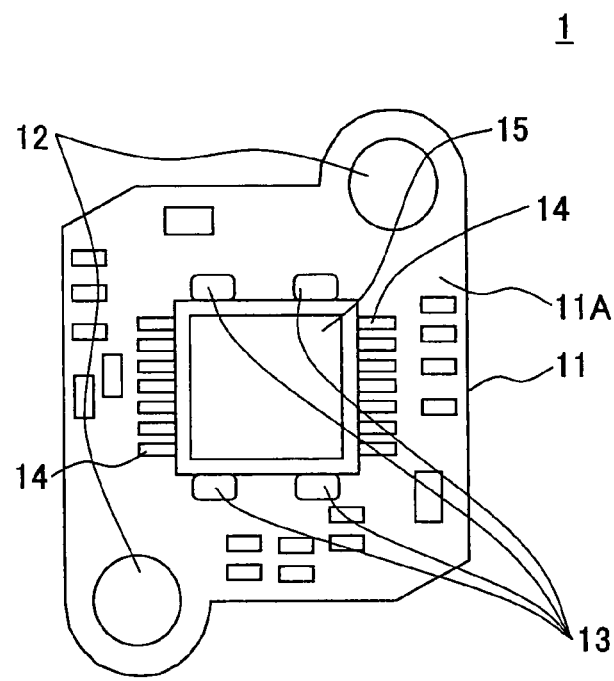
FIG. 1 is a top view showing an optical module.

A description will be given of embodiments of an optical module producing method and an optical module producing apparatus according to the present invention, by referring to the drawings.

Figure 2:
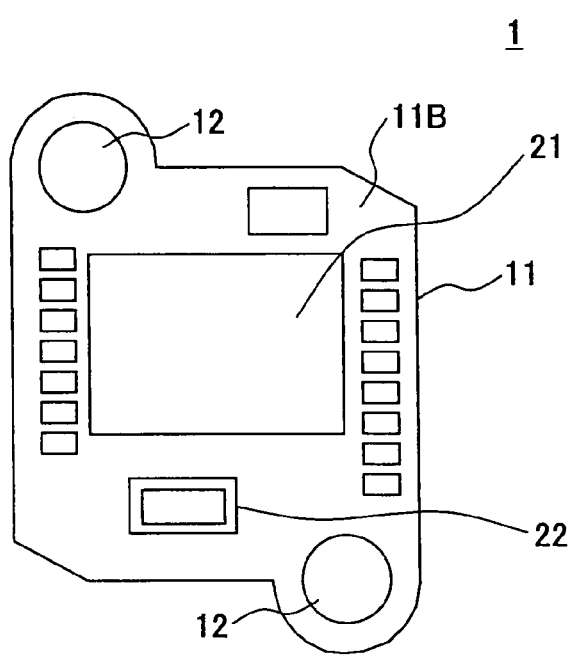
FIG. 2 is a bottom view showing the optical module.
Figure 3:
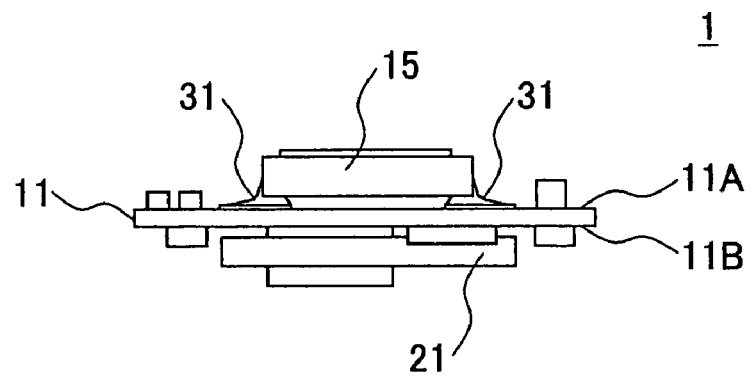
FIG. 3 is a side view showing the optical module.

FIG. 1 is a plan view, that is, a top view showing an optical module that is produced by the optical module producing method and the optical module producing apparatus according to the present invention, FIG. 2 is a bottom view showing this optical module, and FIG. 3 is a side view showing this optical module.

As shown in FIGS. 1 through 3, an optical module 1 has a substrate 11 having a top surface (or substrate surface) 11A and a bottom surface 11B, and various elements are provided on the top and bottom surfaces 11A and 11B. Positioning holes 12, which are used when setting the substrate 11 in an optical module producing apparatus and when mounting the optical module 1 at a desired location on the substrate 11, at the time of producing the optical module 1, penetrate the substrate 11. For example, the substrate 11 is made of FR-4 or FR-5.

The various elements provided on the top surface 11A of the substrate 11 include landing pads 13, terminal pads 14 and an optical element package 15. The optical element package 15 includes a light receiving element such as a CCD and a CMOS device. The various elements provided on the bottom surface 11B of the substrate 11 include a digital signal processor (DSP) package 21 and a connector 22. The DSP package 21 processes signals input to and output from the optical element package 15. The DSP package 21 is located approximately under the optical element package 15 via the substrate 11. The connector 22 is provided to electrically connect the optical module 1 to an external device (not shown) via a connector (not shown) or a cable (not shown). Other elements provided on the top and bottom surfaces 11A and 11B of the substrate 11 may include inductors, capacitors and resistors.

As will be described later, a gap between the optical element package 15 and the substrate surface 11A is determined by the landing pads 13 when the optical element package 15 is mounted on the substrate surface 11A. The gap is at least 150 μm so as to enable satisfactory electrical connection between the terminal pads 14 and terminals 152 of the optical element package 15 by solder 31, and may be set in a range of 150 μm to 200 μm, for example. An adhesive agent (not shown) may fill the gap between the optical element package 15 and the substrate surface 11A. Preferably, the thickness of the landing pads 13 is approximately ⅔ the gap. In the case where the gap is 150 μm, the landing pads 13 preferably have a thickness of approximately 100 μm.

Figure 4:
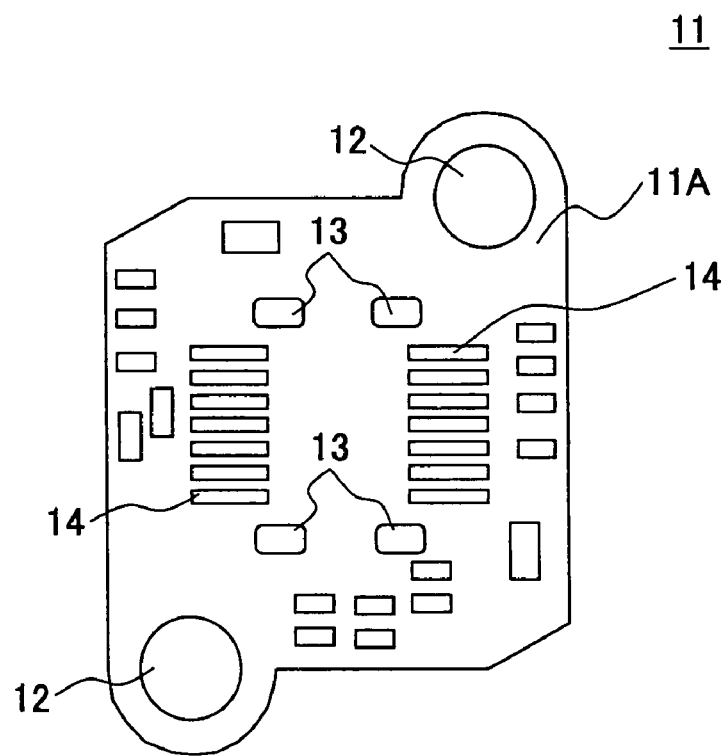
FIG. 4 is a top view showing a substrate of the optical module in a state before an optical element package is mounted thereon.
Figure 5:
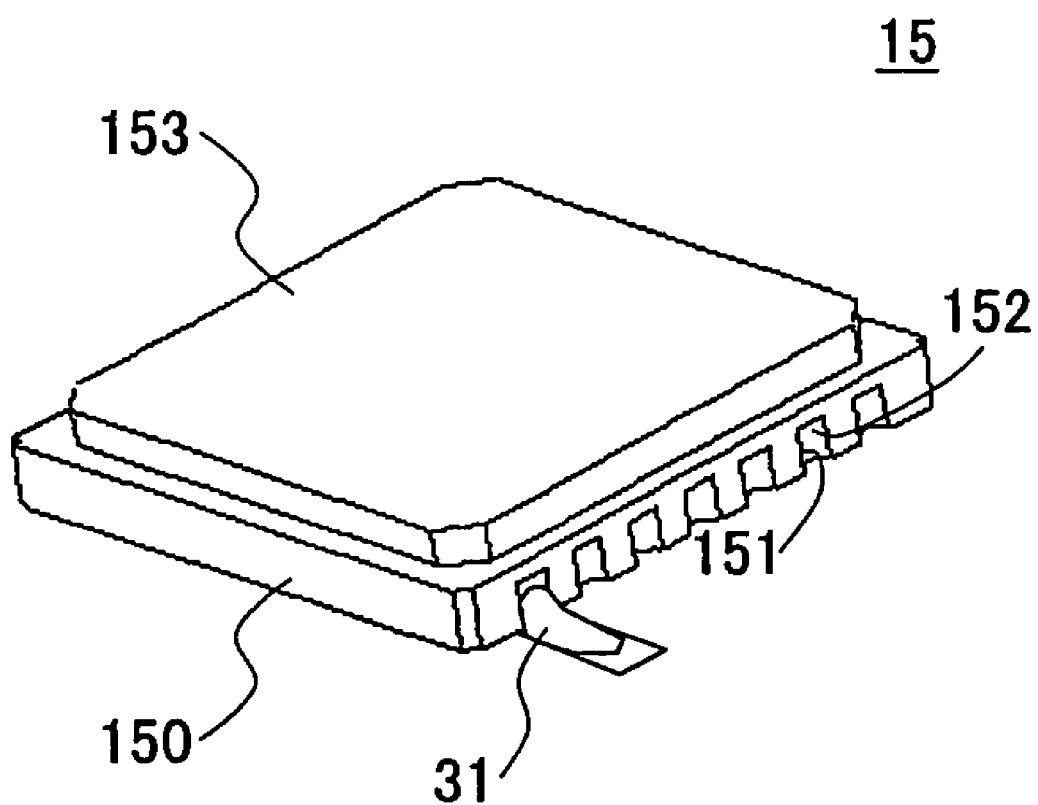
FIG. 5 is a perspective view showing the optical element package.

FIG. 4 is a plan view, that is, a top view showing the substrate 11 of the optical module 1 in a state before the optical element package 15 is mounted thereon, and FIG. 5 is a perspective view showing the optical element package 15.

The landing pads 13 may be made of any suitable material and formed on the substrate surface 11A by a known technique to have a predetermined thickness with a flat top surface. The terminal pads 14 may be made of any suitable conductor material, such as Cu, and formed on the substrate surface 11A by a known technique. A predetermined solder pattern, made of a suitable solder material, is printed on the substrate surface 11A including the terminal pads 14, so as to facilitate the electrical connection by a solder material during a soldering stage. The landing pads 13 and the terminal pads 14 may be formed simultaneously on the substrate surface 11A if the landing pads 13 and the terminal pads 14 are made of the same conductor material. In this case, a resist layer may be additionally formed on the conductor layer to form the landing pads 13. The landing pads 13 are exposed and the terminal pads 14 are partially exposed in a state where the optical element package 15 is mounted on the top surface 11A of the substrate 11, as shown in FIG. 1.

As shown in FIG. 5, the optical element package 15 is made up of a ceramic package 150 having recesses 151 in which the terminals 152 are provided, and a protection layer 153 provided on the ceramic package 150 and protecting the light receiving element within the ceramic package 150. The protection layer 153 is made of glass having a flat top surface which is approximately perpendicular to an optical axis of the optical element package 15. The optical axis of the optical element package 15 is approximately normal to the substrate surface 11A in a state where the optical element package 15 is mounted on the substrate surface 11A.

The optical element package 15 has a rectangular shape in the plan view of FIG. 1. For example, the rectangular optical element package 15 has a size of 8.4 mm×8.4 mm in the plan view, and a total of 14 terminals 152 are arranged at a pitch of 1 mm. The terminal pads 14 on the substrate surface 11A are arranged at a pitch of 0.6 mm, for example. The landing pads 13 on the substrate surface 11A are provided along confronting sides of the rectangular optical element package 15 on an outside of the rectangular optical element package 15 in the plan view, and each of the terminal pads 14 on the substrate surface 11A and the terminals 152 of the optical element package 15 is provided along at least one side of the rectangular optical element package 15 with the terminal pads 14 extending to an inside of the rectangular optical element package 15 in the plan view as may be seen by comparing FIG. 1 and FIG. 4. Each of the terminal pads 14 and the terminals 152 is provided along confronting sides of the rectangular optical element package 15, as shown in FIGS. 4 and 5. The landing pads 13 are provided along the confronting sides of the rectangular optical element package 15 different from the confronting sides of the rectangular optical element package 15 along which the terminal pads 14 and the terminals 152 are provided, as shown in FIG. 1.

The terminal pads 14 are electrically connected to corresponding terminals 152 by the solder 31 which includes the printed solder material and the subsequently applied solder material, as shown in FIG. 3. For the sake of convenience, FIG. 5 shows the solder 31 that electrically connects one pair of terminal pad 14 and terminal 152. As shown in FIG. 5, the solder 31 extends within the recess 151 accommodating the corresponding terminal 152, so as to prevent short-circuiting to an adjacent terminal 152.

The substrate 11 has at least two positioning holes 12 at positions avoiding the optical element package 15. As shown in FIGS. 1, 2 and 4, two positioning holes 12 are arranged at positions approximately along a diagonal direction of the rectangular optical element package 15 which is located approximately at the central portion of the substrate surface 11A.

The length of each of the terminal pads 14 that is exposed is longer than a minimum length required to electrically connect the terminal pad 14 to the corresponding terminal 152 of the optical element package 15 by the solder 31. The length of each of the terminal pads 14 for which the printed solder material is provided is less than or equal to the above minimum length. The length of each of the terminal pads 14 that is exposed may be longer than the minimum length by at least 0.5 mm, and the upper limit may be appropriately determined based on the available area on the substrate surface 11A. A heating portion of the terminal pad 14, corresponding to the length of the terminal pad 14 longer than the minimum length, may be used to preheat the terminal pad 14 to a suitable temperature upon contact with a heating probe when electrically connecting the terminal pad 14 and the corresponding terminal 152 of the optical element package 15 by the solder 31, so as to enable quick and stable melting of the printed solder material and the subsequently applied solder material.

Since the terminal pads 14 are precoated by the printed predetermined solder pattern for at least the minimum length thereof, the thermal conduction is promoted by the printed solder material when the solder material is subsequently applied and the solder materials are melted to form the solder 31 that electrically connects the terminal pads 14 to the corresponding terminals 152 of the optical element package 15. For the sake of convenience, it is assumed that the printed solder material and the subsequently applied solder material are both $Sn_3Ag_{0.5}Cu$ that enables quick and stable melting of the solder material.

The printed solder material and the subsequently applied solder material may be made of the same material but with different compositions. Furthermore, the printed solder material and the subsequently applied solder material may be made of mutually different materials. The solder material that is printed may be relatively hard, while it is preferable for the solder material that is subsequently applied by a dispenser or the like to be relatively soft and to have an approximately constant viscosity when melted compared to the solder material that is printed.

In this particular case, the substrate 11 and the optical element package 15 (that is, the ceramic package 150) are made of materials having mutually different coefficients of thermal expansion, and the substrate 11 and the solder 31 are made of materials having approximately the same coefficients of thermal expansion. Preferably, the substrate 11 is made of FR-5 having a coefficient of linear expansion of 17 ppm/C.° to 18 ppm/C.° in XY directions and 33 ppm/C.° in a Z direction, and the solder 31 is made of $Sn_3Ag_{0.5}Cu$ having a coefficient of linear expansion of 21 ppm/C.° to 23 ppm/C.°. The ceramic package 150 has a coefficient of linear expansion of 7 ppm/C.° to 8 ppm/C.° in the XYZ direction. The XY directions are mutually perpendicular directions on a plane parallel on the substrate surface 11A, and the Z direction is normal to the substrate surface 11A.

Because the landing pads 13 can be formed by a known technique such as that used during a semiconductor device manufacturing process, it is possible to control the flatness of the top surface and the thickness of the landing pads 13 with a high precision. In addition, the flatness of the top surface of the optical element package 15 (that is, the flat top surface of the protection layer 153) is guaranteed by the manufacturer of the optical element package 15. Therefore, by using the landing pads 13 and the top surface of the optical element package 15 to control, with a high precision, the parallel state of the optical element package 15 relative to the substrate surface 11A and the gap between the optical element package 15 and the substrate surface 11A as will be described later, it is possible to make the optical axis of the optical element package 15 approximately normal to the substrate surface 11A in the state where the optical element package 15 is mounted on the substrate surface 11A, to thereby guarantee a desired performance of the optical module 1. It is also possible to improve the reliability of the optical module 1 by the provision of the gap that is accurately controlled to allow the stress caused by the difference between the coefficients of thermal expansion of the materials forming the substrate 11 and the optical element package 15 to be absorbed.

Moreover, when the heating portion of the terminal pad 14, corresponding to the length of the terminal pad 14 longer than the minimum length, is used to preheat the terminal pad 14 to a suitable temperature upon contact with the heating probe when electrically connecting the terminal pad 14 and the corresponding terminal 152 of the optical element package 15 by the printed solder material and the subsequently applied solder material, it is possible to quickly and stably melt the solder materials and accurately control the amount of solder materials applied to each connection, to thereby improve the reliability of the optical module 1.

Furthermore, since the terminal pads 14 are precoated for at least the minimum length thereof by the printed solder material that promotes thermal conduction when the solder 31 electrically connects the terminal pads 14 to the corresponding terminals 152 of the optical element package 15, it is possible to quickly and stably melt the solder materials and accurately control the amount of solder materials applied to each connection, to thereby also improve the reliability of the optical module 1.

As a result, it is unnecessary to subsequently apply a large amount of solder material to ensure positive electrical connection between the corresponding terminal pad 14 and terminal 152, and consequently prevent short-circuiting of adjacent terminal pads 14 and terminals 152 which may otherwise occur if an excessive amount of solder material is subsequently applied. On the other hand, if a small amount of solder material is subsequently applied in order to prevent the short-circuiting of the adjacent terminal pads 14 and terminals 152, the electrical connection may be unreliable if the amount of subsequently applied solder material is insufficient, particularly when the gap is provided between the optical element package 15 and the substrate surface 11A. However, a positive and reliable electrical connection is obtainable in the case described above due to the preheating of the terminal pads 14 and the precoating of the terminal pads 14 made by the printed solder material.

Of course, the size of the rectangular optical element package 15, the number of landing pads 13, and the number of terminals 152 (and the terminal pads 14) are not limited to those described above. The shape of the landing pads 13 is also not limited to the approximate rectangular shape shown in FIGS. 1 and 4. In addition, it is possible to provide the terminals 152, and thus the corresponding terminal pads 14, only along one side of the rectangular optical element package 15. Furthermore, it is not essential to provide the DSP package 21 and the connector 22 on the bottom surface 11B, that is, on the surface opposite to the substrate surface 11A, and at least one of the DSP package 21 and the connector 22 may be provided on the substrate surface 11A. However, from the point of view of efficiently utilizing the limited available area on the substrate 11, it is preferable to provide the optical element package 15 and the DSP package 21 on opposite surfaces of the substrate 11.

Next, a description will be given of an embodiment of the optical module producing apparatus and an embodiment of the optical module producing method according to the present invention, by referring to FIGS. 6 through 17. It is assumed for the sake of convenience that the embodiments of the optical module producing apparatus and the optical module producing method are used to manufacture the optical module 1 described above.

Figure 6:
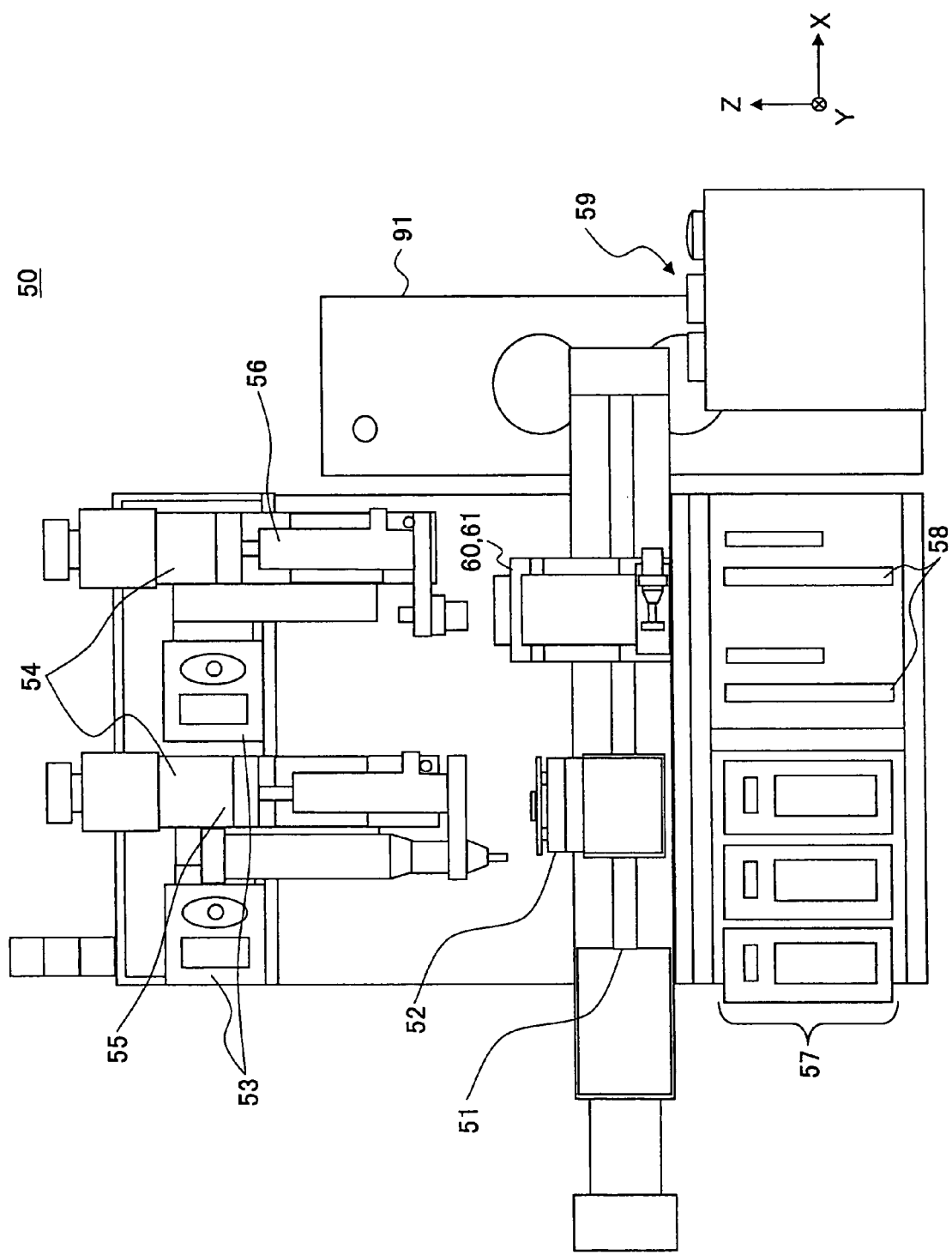
FIG. 6 is a front view showing an embodiment of an optical module producing apparatus according to the present invention.
Figure 7:
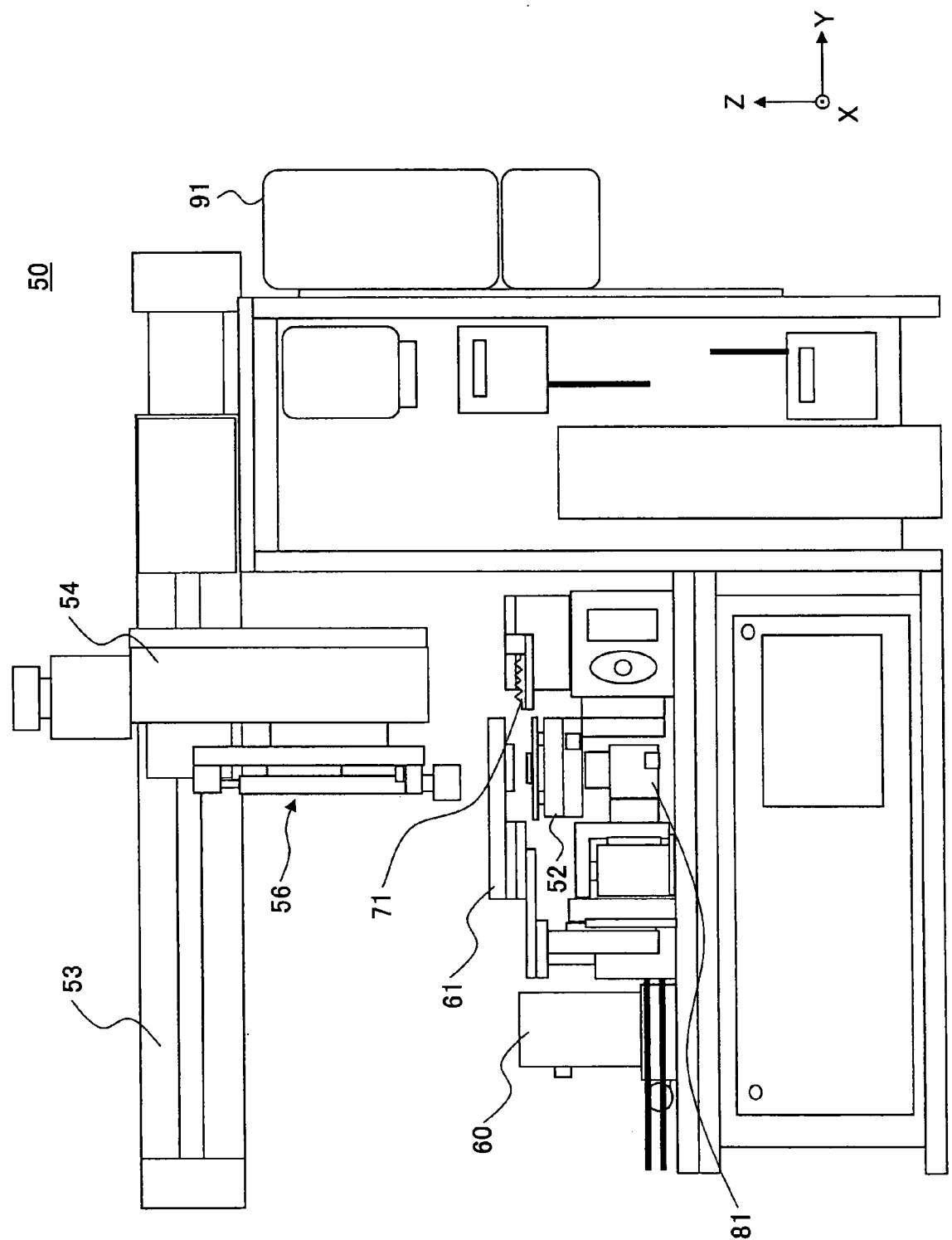
FIG. 7 is a side view showing the embodiment of the optical module producing apparatus.

FIG. 6 is a front view showing this embodiment of the optical module producing apparatus according to the present invention, and FIG. 7 is a side view showing this embodiment of the optical module producing apparatus. As shown in FIGS. 6 and 7, an optical module producing apparatus 50 has an X-direction driving shaft 51, a stage unit 52 that is movable in an X-direction along the X-direction driving shaft 51, first and second Y-direction driving shafts 53, first and second Z-direction driving shafts 54, a coating unit 55 which is movable along the first Y-direction driving shaft 53 in a Y-direction and is movable along the first Z-direction driving shaft 54 in a Z-direction, a mounting unit 56 which is movable along the second Y-direction driving shaft 53 in the Y-direction and is movable along the second Z-direction driving shaft 54 in the Z-direction, a temperature control unit 57, a servo controller 58, an operation part 59 including operation buttons such as a start button, an optical element package supply part 60, a heating head part 61, a cleaning unit 71, a bottom heater part 81, and a control part 91.

The temperature control unit 57 controls the temperature at various parts of the optical module producing apparatus 50. The servo controller 58 controls the movement of the stage unit 51 in the X-direction, and the movements of the coating unit 55 and the mounting unit 56 in the Y-direction. The control part 91 controls the general operation of the entire optical module producing apparatus 50, including the movements of the coating unit 55 and the mounting unit 56 in the Z-direction. In this embodiment, the temperature control unit 57 and the servo controller 58 carry out the control under the control of the control part 91.

The substrate 11 shown in FIG. 4 which is precoated by the predetermined printed solder pattern (printed solder material) and not yet mounted with the optical element package 15, is set on the stage unit 52. With respect to this substrate 11, the coating unit 55 applies on the terminal pads 14, by a dispenser, a solder material (or solder paste, corresponding to the subsequently applied solder material described above) which will be melted together with the printed solder material during a subsequent soldering stage that uses the heating head part 61 to melt the solder materials and electrically connect the terminal pads 14 to the corresponding terminals 152 of the optical element package 15 by the solder 31. The solder material is applied to the terminal pads 14 that have also been precoated by the printed solder material, by moving the coating unit 55 in the Y-direction under the control of the servo controller 58 and in the Z-direction under the control of the control part 91, and moving the stage unit 52 in the X-direction under the control of the servo controller 58.

Next, the stage unit 52 is moved in the X-direction to the position of the heating head part 61 under the control of the servo controller 58. The mounting unit 56 is moved in the Y-direction under the control of the servo controller 58 and in the Z-direction under the control of the control part 91 to catch the optical element package 15 that is supplied by the optical element package supply part 60 by a suction head 101, and places the optical element package 15 on the substrate 11 that is set on the stage unit 52.

Figure 8:
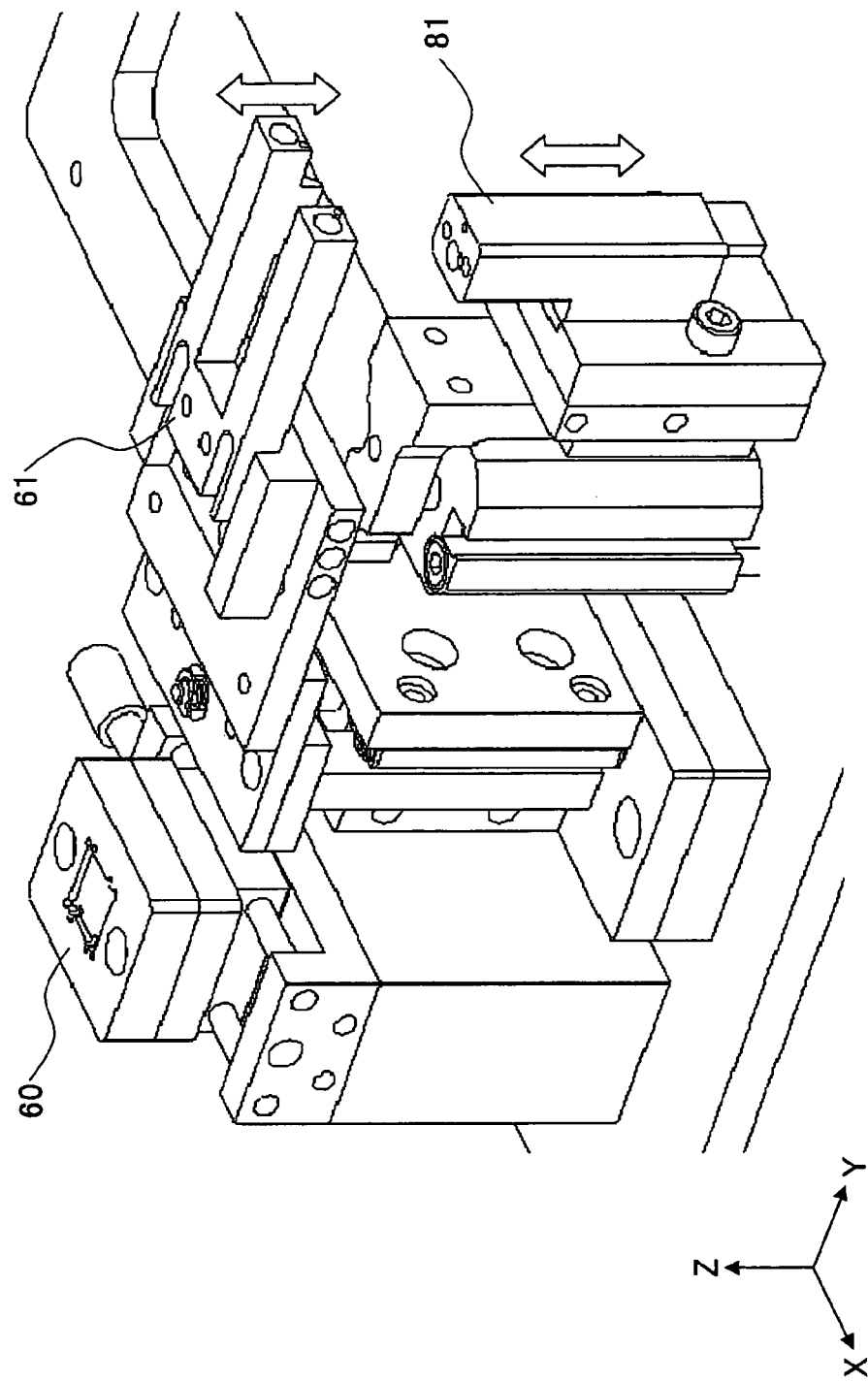
FIG. 8 is a perspective view showing an optical element package supply part, a heating head part and a bottom heater part.
Figure 9:
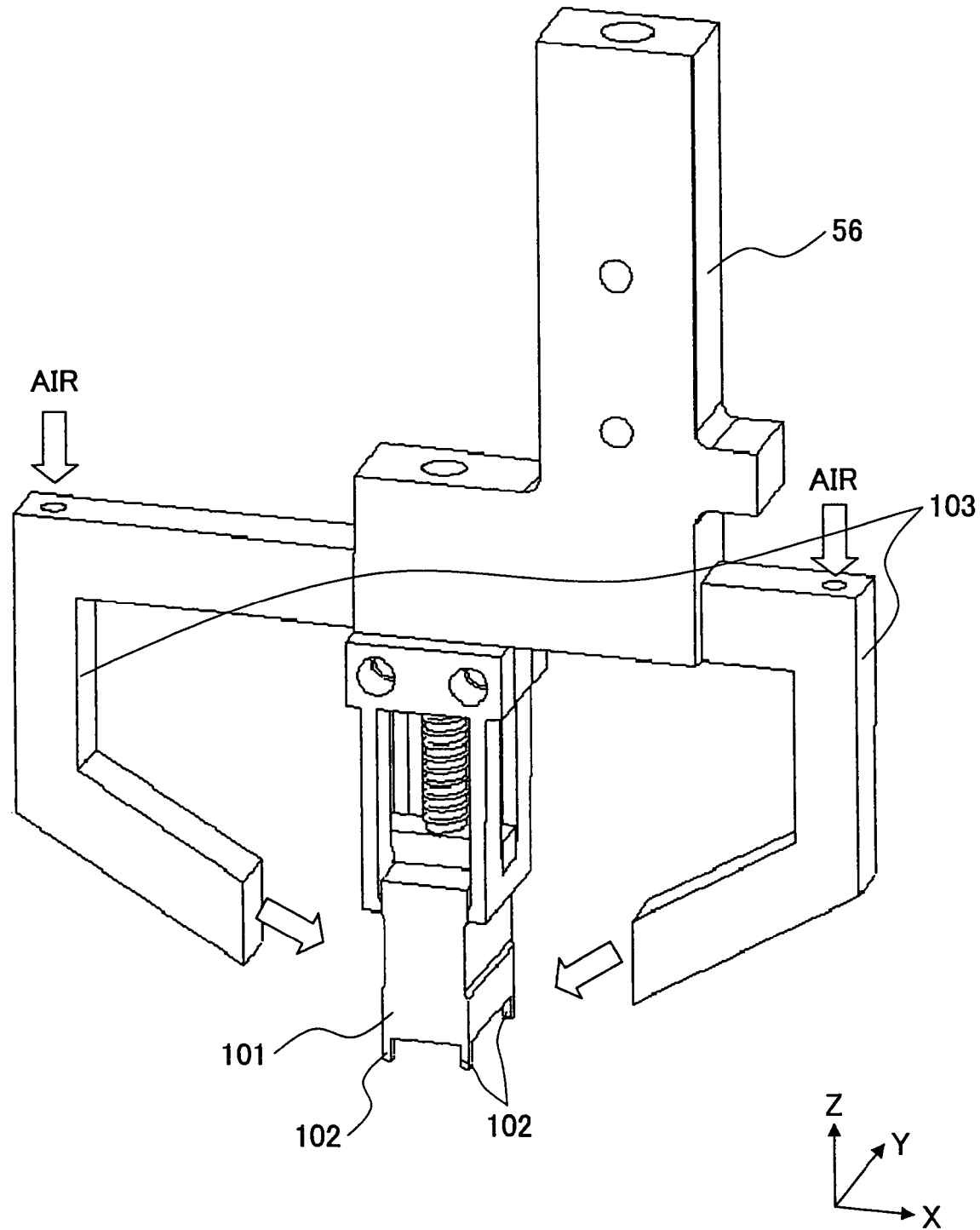
FIG. 9 is a perspective view showing a positioning head mechanism together with a cooling part.
Figure 10A:
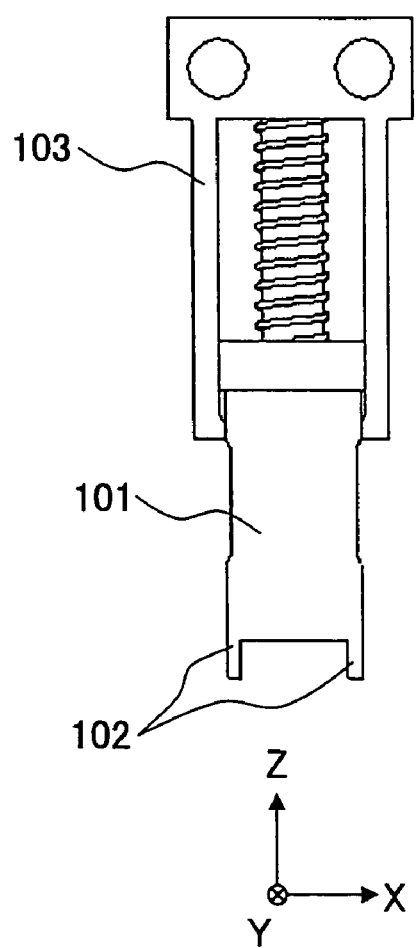
FIGS. 10A and 10B respectively are a front view and a side view showing the positioning head mechanism.
Figure 10B:
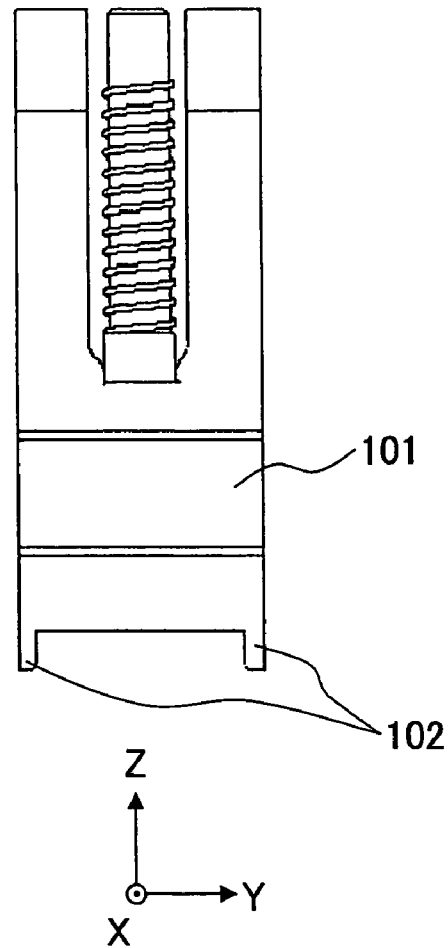
Figure 11:
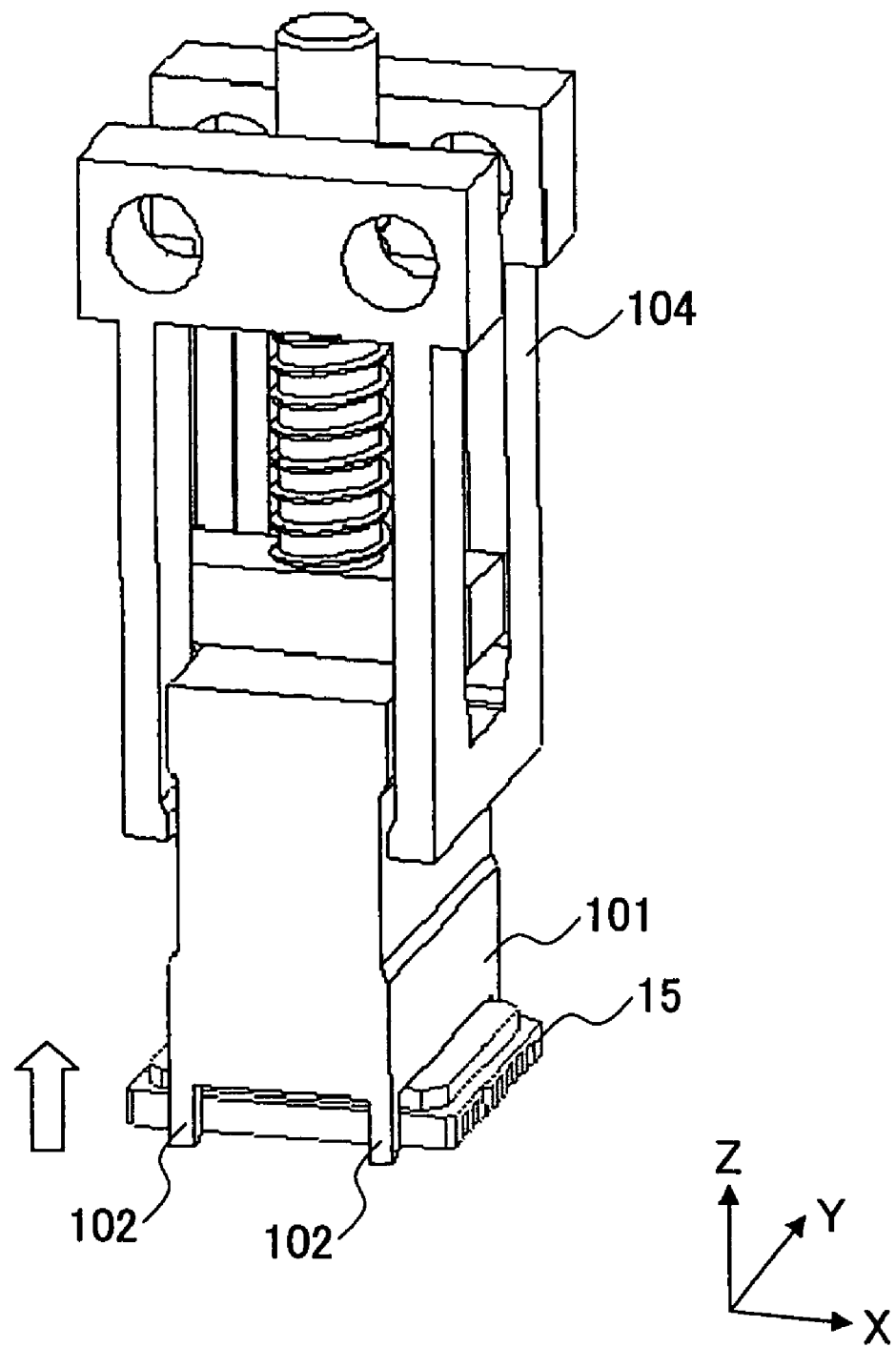
FIG. 11 is a perspective view showing the positioning head mechanism.

FIG. 8 is a perspective view showing the optical element package supply part 60, the heating head part 61 and the bottom heater part 81. Further, FIG. 9 is a perspective view showing a positioning head mechanism together with a cooling part. FIGS. 10A and 10B respectively are a front view and a side view showing the positioning head mechanism, and FIG. 11 is a perspective view showing the positioning head mechanism.

The heating of the substrate 11 from the bottom surface 11B by the bottom heater part 81, and the positioning of the optical element package 15 with respect to the substrate 11 by the positioning head mechanism of the mounting unit 56, are carried out simultaneously. The bottom heater part 81 heats the bottom surface 11B by blowing hot air via holes in the stage unit 52 for a predetermined time so as to prepare for quick and stable melting of the solder material, under the control of the temperature control unit 57. In addition, the heating probes (not shown) of the heating head part 61 contact the heating portions of the terminal pads 14 under the control of the control part 91, and preheat the terminal pads 14 to a suitable temperature under the control of the temperature control unit 57. On the other hand, the positioning head mechanism lowers legs 102 of the suction head 101 in the Z-direction onto the corresponding landing pads 13 on the substrate surface 11A, under the control of the control part 91, to thereby position the optical element package 15 in a parallel state relative to the substrate surface 11A with the gap between the optical element package 15 and the substrate surface 11A accurately controlled to the desired value. The positioning head mechanism forms a copying mechanism for making the top surface of the optical element package 15 copy the substrate surface 11A. Only one of the bottom heater part 81 and the heating probes may be provided. In addition, the bottom heater part 81 and/or the heating probes form a preheating means.

Thereafter, a pair of arms of the heating head part 61 is lowered in the Z-direction to make contact with the solder materials that will form the solder 31 when hardened, under the control of the control part 91, and melts the solder materials to electrically connect the terminal pads 14 to the corresponding terminals 152 of the optical element package 15 when the pair arms is heated to a desired temperature under the control of the temperature control part 57. A temperature sensor (not shown) is provided in a vicinity of the pair of arms, and the temperature control part 57 detects the temperature of the arms based on a detection signal output from this temperature sensor. After raising the arms of the heating head part 61 in the Z-direction away from the substrate 11, under the control of the control part 91, a cooling part 103 shown in FIG. 9 blows air over the solder material so as to harden the melted solder material to form the solder 31, under the control of the temperature control part 57. The heating head part 61 and the cooling part 103 form a soldering means.

Preferably, the arms of the heating head part 61 have a cross sectional shape that permits heat to efficiently conduct to the solder material. In this particular case, each arm has a cross sectional shape such that the cross sectional area along a plane parallel to the XZ plane in FIG. 8 gradually decreases towards the portion of the arm that makes contact with the solder material.

Figure 12:
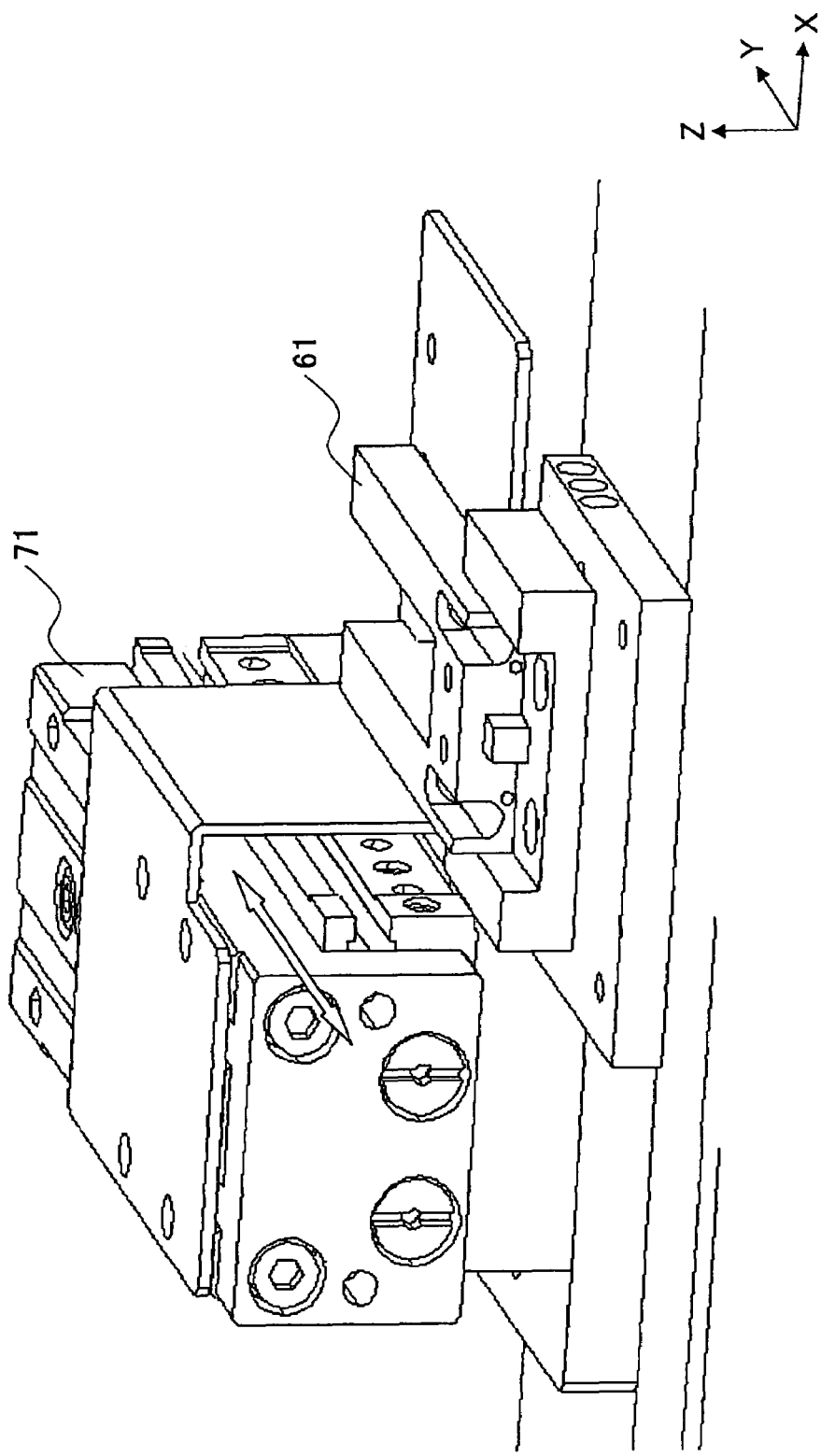
FIG. 12 is a perspective view showing a head cleaning unit.
Figure 13:
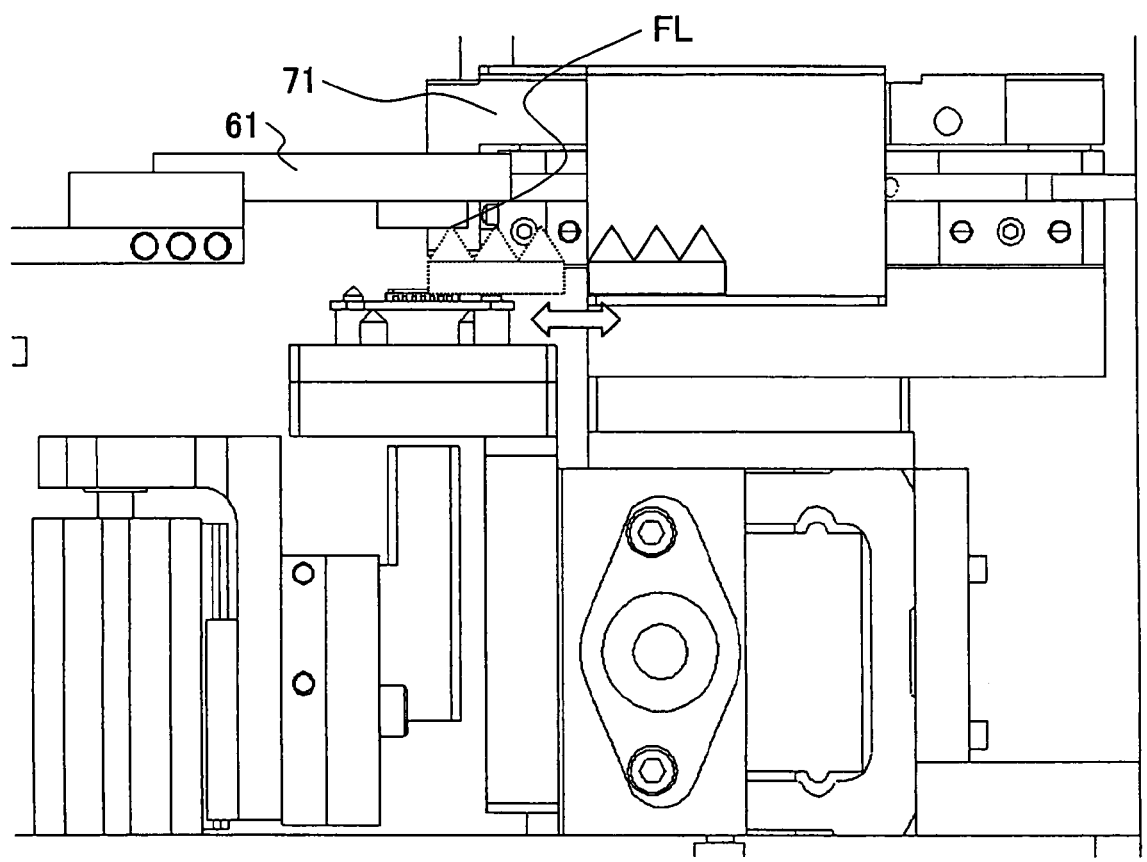
FIG. 13 is a side view showing the head cleaning unit.

FIG. 12 is a perspective view showing the head cleaning unit 71, and FIG. 13 is a side view showing the head cleaning unit 71. The head cleaning unit 71 cleans the heating head part 61 at an arbitrary timing, under the control of the control part 91, to remove residual flux on the heating head part 61 and improve the heating or melting stability of the solder 31. More particularly, the head cleaning unit 71 has a plurality of blades that move in the Y-direction against the lower surface of the pair of arms of the heating head part 61 as indicated by FL in FIG. 13, so as to scrape off the residual flux adhered on the lower surface of the pair of arms.

Figure 14:
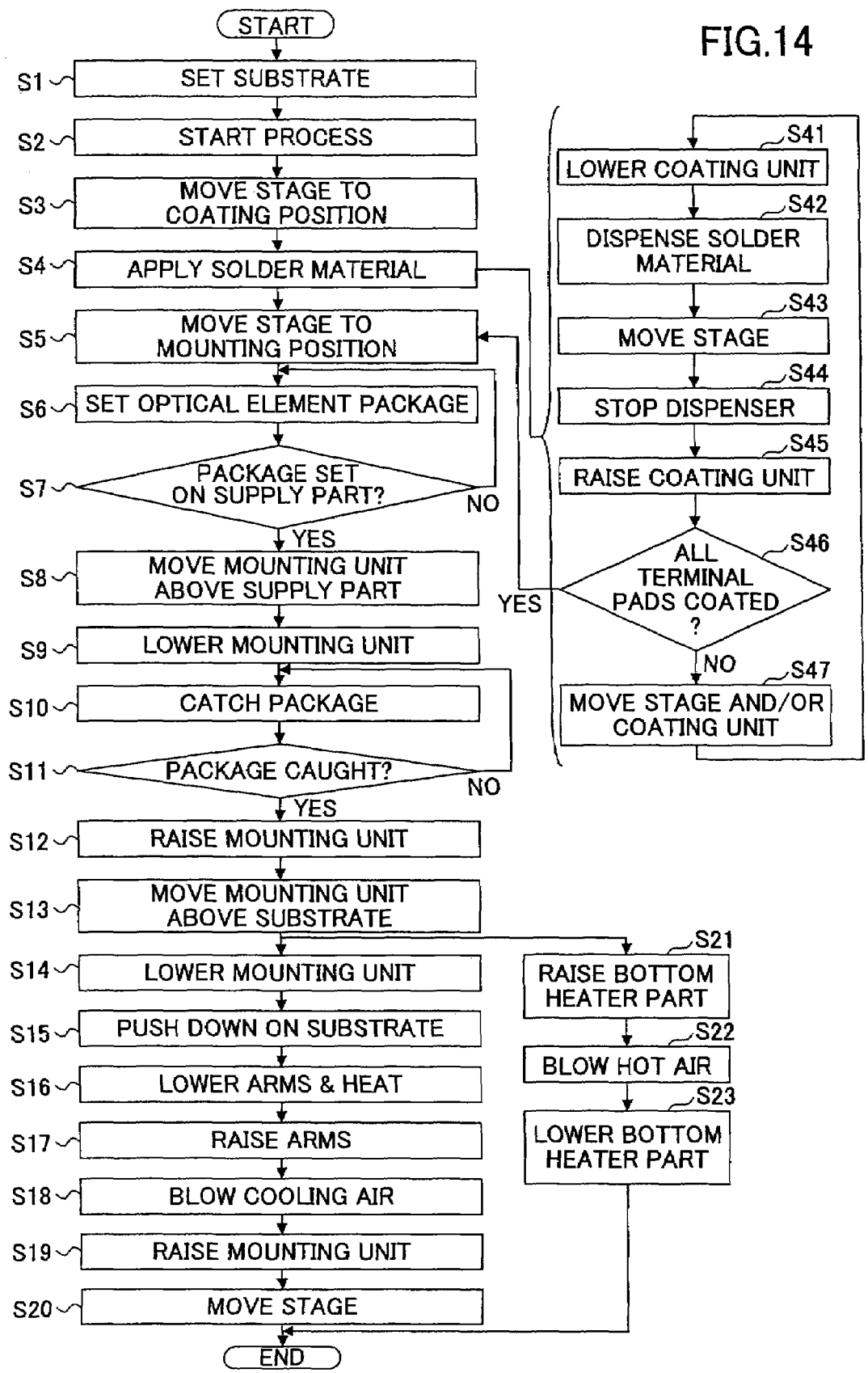
FIG. 14 is a flow chart for explaining an embodiment of an optical module producing method according to the present invention.

FIG. 14 is a flow chart for explaining this embodiment of the optical module producing method according to the present invention.

In FIG. 14, the substrate 11 is set on the stage unit 52 in a step S1, manually by an operator or, automatically by a robot (not shown), and the control part 91 detects that the substrate 11 is set on the stage unit 52 in response to a detection signal output from a substrate sensor (not shown) of the stage unit 52. The optical module producing process is started in a step S2 when the operator pushes the start button on the operation part 59, by the control part 91 which detects a start signal that is issued by the pushing of the start button. The stage unit 52 is moved in the X-direction to a working position (that is, a coating position) of the coating unit 55 in a step S3, under the control of the servo controller 58. The coating unit 55 applies on the terminal pads 14, by the dispenser in a step S4, under the control of the control part 91, the solder material (or solder paste, corresponding to the subsequently applied solder material described above) which will be melted together with the printed solder material during the subsequent soldering stage that uses the heating head part 61 to melt the solder materials and electrically connect the terminal pads 14 to the corresponding terminals 152 of the optical element package 15 by the solder 31.

The step S4 includes steps S41 through S47. The coating unit 55 is lowered in the Z-direction in the step S41, and the solder material is dispensed on the terminal pad 14 in the step S42. The stage unit 52 is moved in the X-direction so as to apply and coat the solder material on the terminal pad 14 for at least the minimum length described above in the step S43, and the dispensing of the solder material is stopped in the step S44. The coating unit 55 is raised in the Z-direction in the step S45, and a step S46 decides whether or not all of the terminal pads 14 on the substrate 11 have been coated by the solder material. The process advances to a step S5 if the decision result in the step S46 is YES. On the other hand, if the decision result in the step S46 is NO, the stage unit 52 is moved in the X-direction and/or the coating unit 55 is moved in the Y-direction in the step S47 so as to prepare for the coating of the next terminal pad 14, and the process returns to the step S41.

The stage unit 52 is moved in the X-direction to a working position (that is, a mounting position) of the mounting unit 56 in the step S5, under the control of the servo controller 58. The optical element package 15 is set on the optical element package supply part 60 in a step S6, manually by the operator or, automatically by a robot (not shown). A step S7 decides whether or not the optical element package 15 is set on the optical element package supply part 60 in response to an output of a supply part sensor (not shown) which detects the optical element package 15. The control part 91 can detect if the optical element package 15 is set on the optical element package supply part 60 in response to the output of the supply part sensor. If the decision result in the step S7 becomes YES, the mounting unit 56 is moved in the Y-direction above the optical element package supply part 60 in a step S8, under the control of the servo controller 58, and is lowered in the Z-direction in a step S9 under the control of the control part 91. The mounting unit 56 catches the optical element package 15 that is set on the optical element package supply part 60 by the suction head 101 in a step S10, under the control of the control part 91, and a step S11 decides whether or not the optical element package 15 has been caught by the suction head 101 in response to an output of a suction head sensor (not shown) which detects the optical element package 15. The control part 91 can detect if the suction head 101 has caught the optical element package 15 in response to the output of the suction head sensor. If the decision result in the step S11 becomes YES, the mounting unit 56 is raised in the Z-direction in a step S12, under the control of the control part 91. The mounting unit 56 is then moved in the Y-direction above the substrate 11 on the stage unit 52 in a step S13, under the control of the servo controller 58.

Steps S14 through S20 and steps S21 through S23 are carried out simultaneously. The bottom heater part 81 is raised in the Z-direction under the control of the control part 91, and the heating probes of the heating head part 61 contact the heating portions of the terminal pads 14 under the control of the control part 91 and preheat the terminal pads 14 to a suitable temperature under the control of the temperature control unit 57, in the step S21. The bottom heater part 81 blows hot air via the holes in the stage unit 52 onto the bottom surface 11B of the substrate 11 for a predetermined time of 10 seconds, for example, in the step S22, under the control of the temperature control unit 57, so as to prepare for quick and stable melting of the solder materials on the terminal pads 14. The bottom heater part 81 stops blowing the hot air under the control of the temperature control unit 57 and is lowered in the Z-direction under the control of the control part 91 after the predetermined time in the step S23. In addition, the heating probes of the heating head part 61 separate from the terminal pads 14 under the control of the control part 91.

On the other hand, the mounting unit 56 carrying the optical element package 15 is lowered in the Z-direction in the step S14, under the control of the control part 91. The positioning head mechanism of the mounting unit 56 lowers the legs 102 of the suction head 101 onto the corresponding landing pads 13 on the substrate surface 11A, and pushes down on the landing pads 13 for a predetermined time of 10 seconds, for example, in the step S15, under the control of the control part 91, to thereby position the optical element package 15 in a parallel state relative to the substrate surface 11A with the gap between the optical element package 15 and the substrate surface 11A accurately controlled to the desired value. The arms of the heating head part 61 are lowered in the Z-direction to a position to make contact with the solder material under the control of the control part 91, and the pair of arms of the heating head part 61 is heated to a desired temperature under the control of the temperature control part 57, in the step S16, so as to melt the solder material in contact with each arm. Preferably, the temperature of each arm is raised to the desired temperature by before each arm makes contact with the solder material. Accordingly, the optical element package 15 is positioned to the state parallel with respect to the substrate surface 11A, with the gap between the optical element package 15 and the substrate surface 11A accurately controlled to the desired value, and the solder material for electrically connecting the terminal pads 14 and the corresponding terminals 152 of the optical element package 15 is melted. The pair of arms of the heating head part 61 is raised in the Z-direction under the control of the control part 91, in the step S17. The cooling part 103 blows air over the solder material for a predetermined time of 4 seconds, for example, in the step S18, under the control of the control part 91 or the temperature control unit 57, so as to harden the melted solder materials to form the solder 31. Thereafter, the mounting unit 56 is raised in the Z-direction in the step S19, under the control of the control part 91, and the stage unit 52 is moved in the X-direction in the step S20, under the control of the servo controller 58, to an unload position where the completed optical module 1 may be removed from the stage unit 52 manually by the operator or, automatically by a robot (not shown).

According to experiments conducted by the present inventors, it was confirmed that, for the optical module 1 mounted with the optical element package 15 having the size described above and the number of terminal pads 14 described above, the optical element package 15 can be guaranteed to be approximately parallel to the substrate surface 11A, and that the mounting error is only within a range of ±50 μm from the perfectly parallel state and is effectively suppressed.

Figures 15, 16:
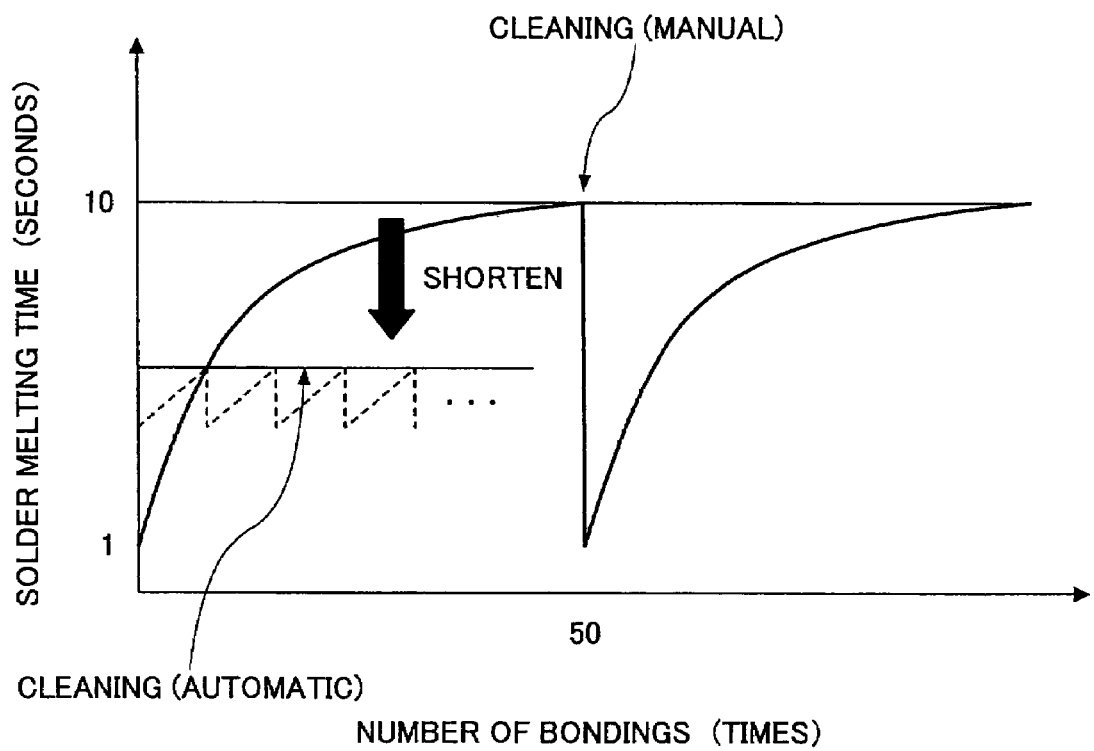
FIG. 15 is a diagram showing results of experiments related to surface materials of arms of a head heating part conducted by the present inventors.
FIG. 16 is a diagram showing results of experiments related to effects of cleaning the arms conducted by the present inventors.

At least the surface portion of the pair of arms of the heating head part 61 that makes contact with the solder material may be made of SUS, Cu+Cr, G04+Cr and the like. FIG. 15 is a diagram showing results of experiments related to surface materials of the arms of the head heating part 61 conducted by the present inventors. According to experiments conducted by the present inventors, it was confirmed that Cu+Cr or G04+Cr is preferable as the arm surface material from the point of view of the relatively short time it takes for the arm temperature to rise to a desired temperature of approximately 300° C. or higher, as indicated by symbols "o" in FIG. 15. But from the point of view of the durability of the arm even when the surface is scraped by the blades of the head cleaning unit 71, it was confirmed that SUS or G04+Cr is preferable as the arm surface material, as indicated by symbols "o" in FIG. 15. In FIG. 15, symbols "x" indicate that the material is not suited for the arm surface material from the point of view of the melting start time or durability. Therefore, it was confirmed that G04+Cr is particularly preferable for use as the arm material forming at least the surface portion of the pair of arms of the heating head part 61.

FIG. 16 is a diagram showing results of experiments related to effects of cleaning the arms conducted by the present inventors. According to experiments conducted by the present inventors, it was also found that the flux that adheres on the surface of the pair of arms of the heating head part 61 after repeated heating and melting of the solder materials gradually increases the solder melting time. It was found that the solder material melting time increases from approximately 1 second to approximately 10 seconds as shown in FIG. 16 after the heating head part 61 carries out the solder melting operation with respect to 50 optical modules 1 mounted with the optical element package 15 having the size described above and the number of terminal pads 14 described above. Hence, it was found that the solder material melting time is effectively reduced by manually cleaning the arms of the heating head part 61 for every 50 optical modules 1, for example, as shown in FIG. 16. Furthermore, it was also found that the solder material melting time is effectively reduced to approximately 5 seconds or less, for example, as indicated by a bold arrow in FIG. 16, by automatically carrying out the cleaning periodically as indicated by dotted lines in FIG. 16.

FIG. 17 is a system block diagram showing a control system of the optical module producing apparatus 51. The control system shown in FIG. 17 includes the servo controller 58, the temperature control part 57 and the control part 91. The detection signals output from the various sensors described above are input to the control part 91. The control part 91 controls a Z-direction driving part 603 which drives and moves the coating unit 55, the mounting unit 56 and the heating head part 61 in the Z-direction. The control part 91 also carries out various control operations with respect to various parts of the optical module producing apparatus 51. Of course, the Z-direction driving part 603 may be formed by a plurality of driving means for driving the coating unit 55, the mounting unit 56 and the heating head part 61.

The servo controller 58 controls an X-direction driving part 601 for driving and moving the stage unit 52 in the X-direction, under the control of the control part 91. In addition, the servo controller 58 controls a Y-direction driving part 602 for driving and moving the coating unit 55 and the mounting unit 56 in the Y-direction, under the control of the control part 91. The temperature control part 57 controls the bottom heater part 81, the cooling part 103, the heating probes of the heating head part 61 and the like, under the control of the control part 91. Of course, the Y-direction driving part 602 may be formed by a plurality of driving means for driving the coating unit 55 and the mounting unit 56.

This application claims the benefit of a Japanese Patent Application No. 2006-291992 filed Oct. 27, 2006, in the Japanese Patent Office, the disclosure of which is hereby incorporated by reference.

Further, the present invention is not limited to these embodiments, but various variations and modifications may be made without departing from the scope of the present invention.

What is claimed is:

1. An optical module producing method comprising the steps of:
    (a) with respect to a substrate having a substrate surface provided with terminal pads and landing pads, coating a solder material on the terminal pads;
    (b) mounting an optical element package having terminals and a flat top surface on the substrate using the landing pads so that the top surface becomes approximately parallel to the substrate surface and a gap is formed between a bottom surface of the optical element package and the substrate surface;
    (c) preheating the terminal pads simultaneously as carrying out the step (b); and
    (d) electrically connecting the terminal pads to corresponding terminals of the optical element package by melting the solder material and thereafter hardening the solder material.

2. The optical module producing method as claimed in claim 1, wherein the step (b) determines the gap by pushing legs of a positioning head mechanism against the landing pads in a state where the top surface of the optical element package is held by the positioning head mechanism, and the step (d) causes heated arms of a heating head part to make contact and melt the solder material in the state where the gap is determined.

3. The optical module producing method as claimed in claim 1, wherein the step (c) preheats the substrate from a side opposite to the substrate surface.

4. The optical module producing method as claimed in claim 1, wherein the step (c) preheats the terminal pads by causing heating probes to make contact with portions of the terminal pads not coated with the solder material.

5. The optical module producing method as claimed in claim 1, wherein the terminal pads are precoated with a solder material prior to the step (a).

6. The optical module producing method as claimed in claim 1, wherein the gap is at least 150 μm.

7. The optical module producing method as claimed in claim 1, wherein the optical element package comprises a CCD or a CMOS device, and the step (b) mounts the optical element package on the substrate surface so that an optical axis of the optical element package is approximately normal to the substrate surface.

8. The optical module producing method as claimed in claim 1, wherein the optical element package has a rectangular shape in a plan view, the landing pads are provided on the substrate surface along confronting sides of the rectangular optical element package in the plan view, and the terminal pads are provided on the substrate surface along corresponding sides of the rectangular optical element package in the plan view.

9. The optical module producing method as claimed in claim 8, further comprising the steps of:
(e) setting the substrate on a stage unit using a pair of positioning holes that penetrate the substrate, and the positioning holes are arranged at positions avoiding the rectangular optical element package and approximately along a diagonal direction of the rectangular optical element package.

* * * * *